United States Patent [19]

Masuda

[11] Patent Number: 5,394,364
[45] Date of Patent: Feb. 28, 1995

[54] HIGH-SPEED MEMORY READOUT CIRCUIT USING A SINGLE SET OF DATA BUFFERS

[75] Inventor: Takafumi Masuda, Tokyo, Japan

[73] Assignee: NEC Corporation, Tokyo, Japan

[21] Appl. No.: 220,979

[22] Filed: Mar. 31, 1994

[30] Foreign Application Priority Data

Apr. 1, 1993 [JP] Japan ................................. 5-075979

[51] Int. Cl.$^6$ ............................................... G11C 7/00
[52] U.S. Cl. ........................... 365/189.01; 365/189.05;
365/230.08
[58] Field of Search ....................... 365/230.08, 189.01,
365/189.05, 221, 239

[56] References Cited

U.S. PATENT DOCUMENTS

| | | | |
|---|---|---|---|
| 4,831,590 | 5/1989 | Ichinose | 365/189.05 |
| 5,146,428 | 9/1992 | Tanimura | 365/189.05 |
| 5,319,595 | 6/1994 | Sarnwatari | 365/189.01 |

FOREIGN PATENT DOCUMENTS 58-53087  3/1983  Japan .

*Primary Examiner*—Eugene R. LaRoche
*Assistant Examiner*—Tan Nguyen
*Attorney, Agent, or Firm*—Sughrue, Mion, Zinn, Macpeak & Seas

[57] ABSTRACT

In a memory readout circuit, a data register is provided for storing data bits of a word read out of a memory cell array. Connected to the data register is a transfer gate array which is equally divided into groups of first to k-th transfer gates. First to k-th data buffers are connected respectively to the first to k-th transfer gates of different groups. One of the groups of transfer gates is selected and the transfer gates of the selected group transfers first to k-th data bits of unit data from the data register to the first to k-th data buffers, respectively. From the data bits stored in the data buffers, i-th to k-th data bits (where i is in a range from 1 to k) are selected. If i is not equal to k, the stored i-th to (k−1)th data bits are read out of the buffers to an external circuit and the k-th data bit is stored into a latch when the (k−1)th data bit is read out to the output and reads out the k-th data bit from the latch circuit to the external circuit when data bits of subsequent unit data are transferred to the data buffers. If i is equal to k, the k-th data bit is read out of the buffer to the external circuit when data bits of subsequent unit data are transferred to the data buffers.

3 Claims, 4 Drawing Sheets

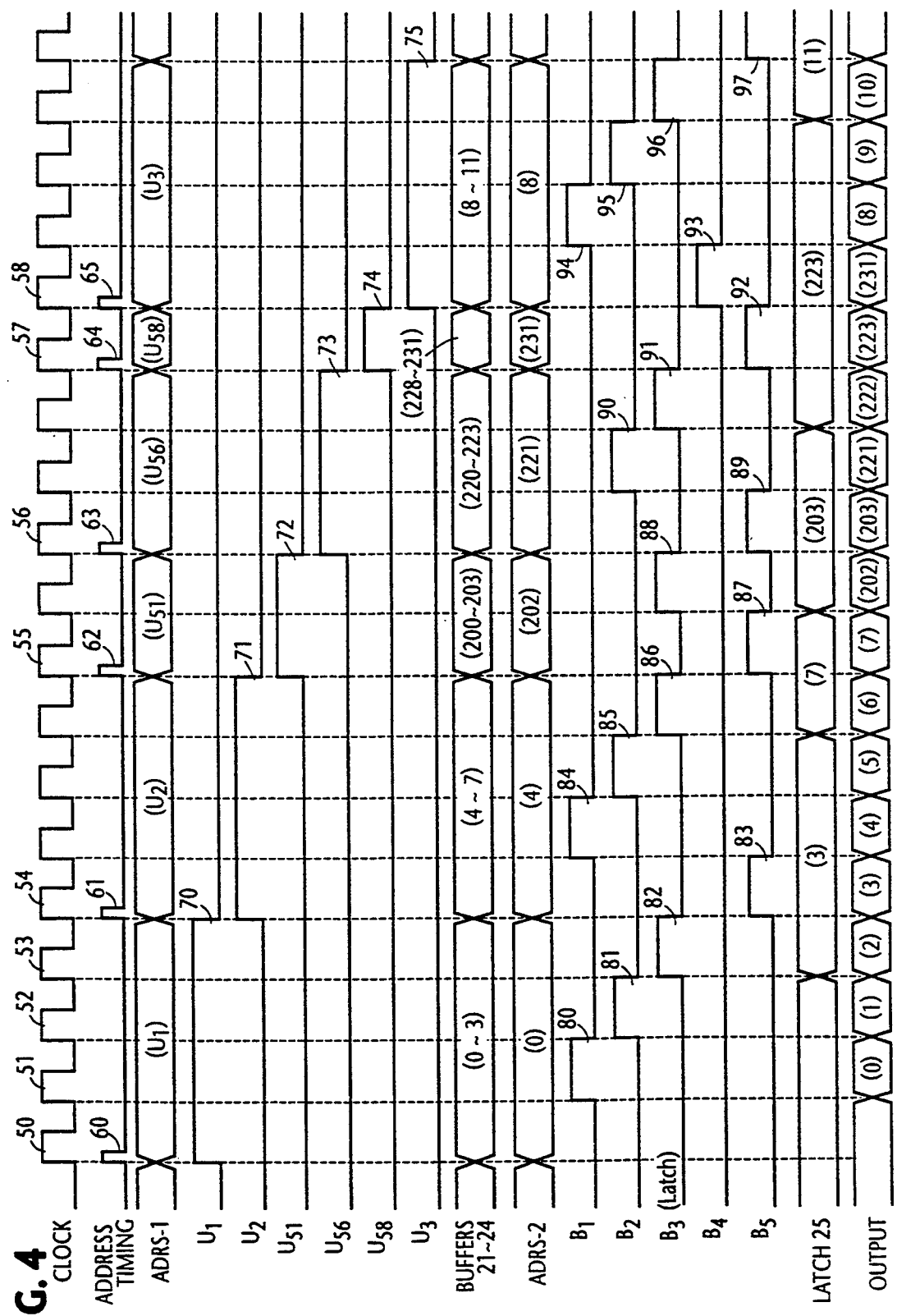

HIGH-SPEED MEMORY READOUT CIRCUIT USING A SINGLE SET OF DATA BUFFERS

BACKGROUND OF THE INVENTION

1. Field of the Invention

The present invention relates to a circuit arrangement for sequentially outputting data bits of a selected word read out from a memory cell array.

2. Description of the Related Art

According to a prior art memory readout circuit which is shown in FIG. 1, a memory cell array 1 stores 256-bit words of data. In response to a read enable pulse from a read/write controller 6,256 bits of a word is simultaneously transferred by a transfer gate array 2 to a data register 3 which is connected to a transfer gate array 4. The latter is divided equally into upper and lower groups of 128 transfer gates and each group is further divided into 32 subgroups of 4 transfer gates each, so that the transfer gates of each subgroup store first to fourth data bits as a unit of data to be transferred. The transfer gates of the upper group are connected respectively to data buffers 7 and those of the lower group are connected respectively to data buffers 8. In response to an address signal from read/write controller 6, a unit data selector 5 alternately selects upper and lower groups of transfer gate array 4 and identifies one of the subgroups of the selected group to cause the transfer gates of the identified subgroup to transfer the data bits stored therein to corresponding data buffers. A gate array 9 is provided for reading data bits from data buffers 7 and 8 onto an external circuit via a buffer amplifier 11 in response to control signals from a data bit selector 10 which responds to an address signal from controller 6.

While high speed reading is possible, the alternate reading of upper and lower groups of data prevents data from being read in sequence from the same group. Additionally, the use of two set of data buffers adds extra complexity and hardware.

SUMMARY OF THE INVENTION

It is therefore an object of the present invention to provide a high speed memory readout circuit capable of reading data in sequence from any location of data register.

According to the present invention, there is provided a circuit arrangement for a memory cell array in which data bits of a plurality of words are stored. The circuit arrangement comprises a data register coupled to the memory cell array for storing data bits of a word read out from the memory cell array. Connected to the data register is a transfer gate array which is equally divided into groups of first to k-th transfer gates. First to k-th data buffers are connected respectively to the first to k-th transfer gates of different groups. A first readout circuit selects one of the groups of transfer gates and causes the transfer gates of the selected group to transfer first to k-th data bits of unit data from the data register to the first to k-th data buffers, respectively. A second readout circuit selects i-th to k-th data bits (where i is in a range from 1 to k) stored in the i-th to the k-th data buffers. If i is not equal to k, the second readout circuit sequentially reads out the stored i-th to (k−1)th data bits onto an output of the circuit arrangement and stores the k-th data bit into a latch circuit when the (k−1)th data bit is read out to the output of the circuit arrangement and reads out the k-th data bit from the latch circuit to the output terminal when data bits of subsequent unit data are transferred to the data buffers. If i is equal to k, the second readout circuit reads out the k-th data bit to the output of the circuit arrangement when data bits of subsequent unit data are transferred to the data buffers.

When reading i-th to k-th data bits from the data buffers, the k-th bit is stored in the latch circuit at the time of delivery of the (k−1)th bit from the (k−1)th data buffer to the output of the circuit arrangement and the latched data bit is delivered at the same time the next unit data is transferred to the data buffers. When reading only the k-th data bit, it is simply read out from the buffer to the output of the circuit arrangement simultaneously with the transfer of the next unit data to the data buffers. As a result, high speed memory read operation can be achieved and data bits can be sequentially retrieved from any location of the data register.

Preferably, the second readout circuit is implemented with a first to k-th gate means, or transistors, connected respectively between the outputs of the first to k-th data buffers and the output of the circuit arrangement, a (k+1)th transistor connected between the output of the k-th data buffer and the input of the latch circuit, a (k+2)th transistor connected between the output of the latch circuit and the output of the circuit arrangement. When the selected i-th data bit is not equal to the k-th data bit, the i-th to (k−1)th transistors are sequentially activated and the (k+1)th transistor and the latch circuit are simultaneously activated when the (k−1)th transistor is activated. The (k+2) transistor is activated to output the latched data bit when the data bits of subsequent unit data are transferred to the data buffers. When the selected i-th data bit is equal to the k-th data bit, the k-th transistor is activated simultaneously with the transfer of the subsequent data bits to the data buffers.

BRIEF DESCRIPTION OF THE DRAWINGS

The present invention will be described in further detail with reference to the accompanying drawings, in which:

FIG. 4 is a timing diagram for describing the operation of this invention.

DETAILED DESCRIPTION

Figure 1:
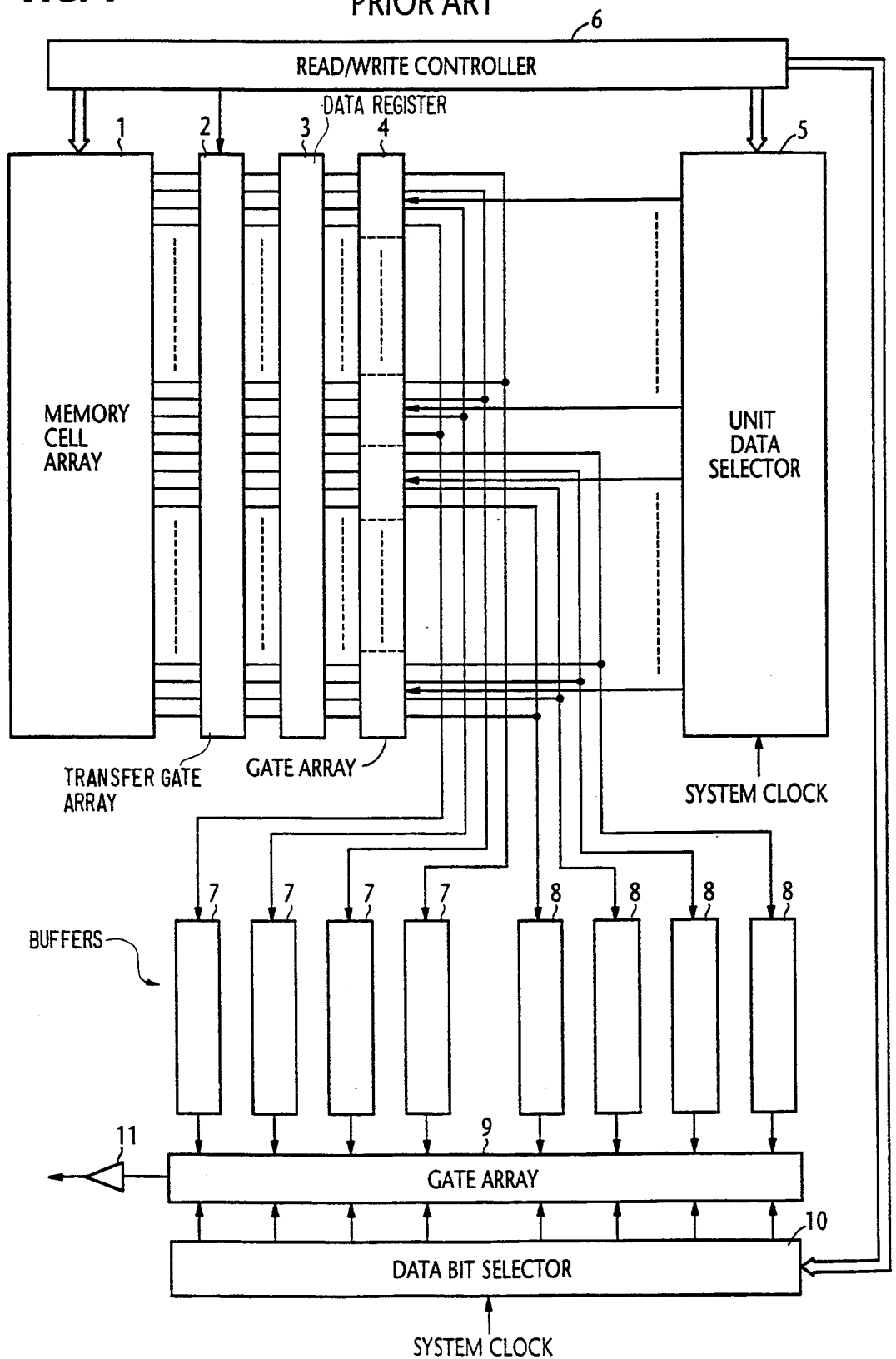
FIG. 1 is a block diagram of a prior art memory circuit.
Figure 2:
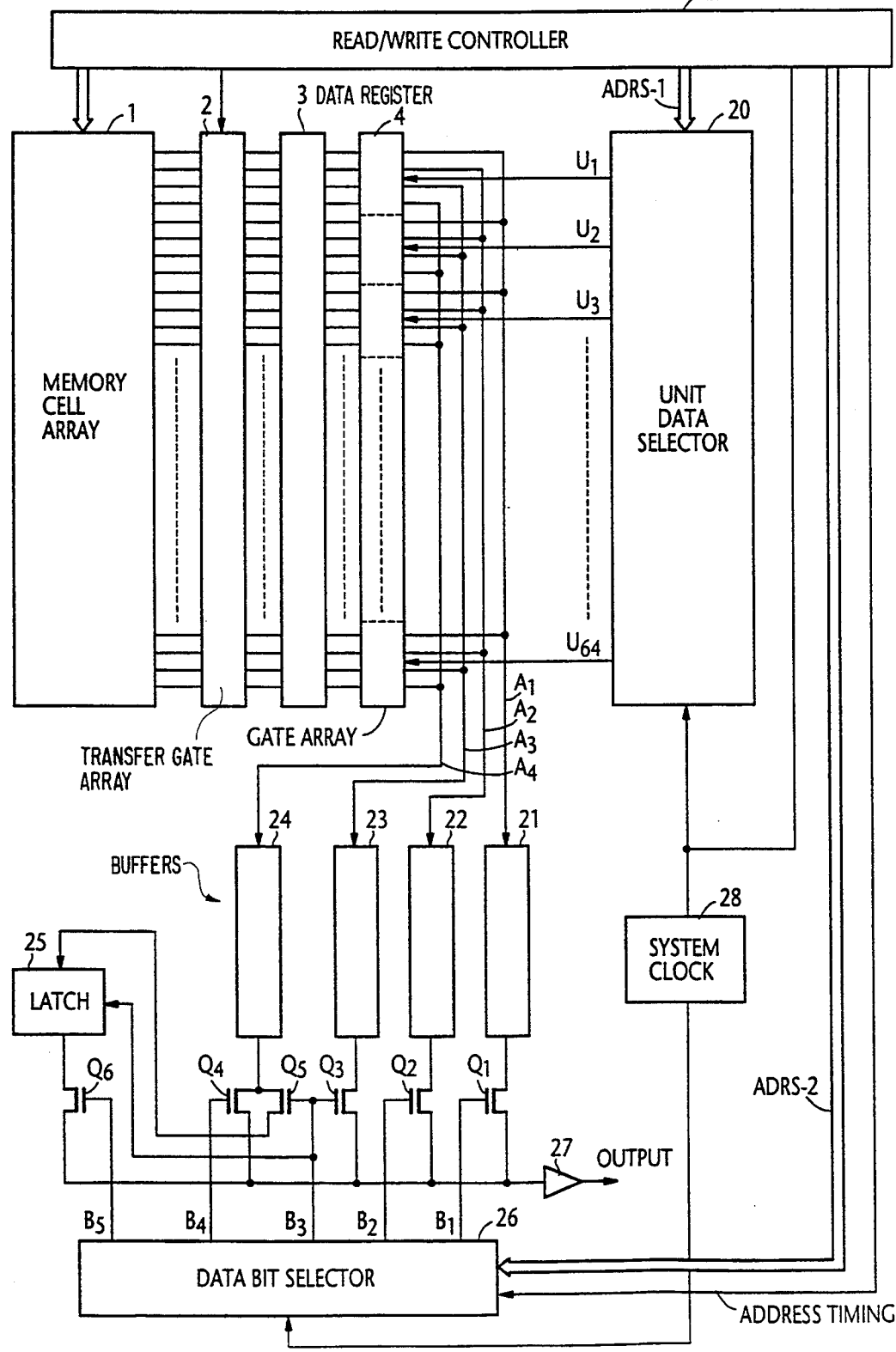
FIG. 2 is a block diagram of a memory circuit according to the present invention.

Referring now to FIG. 2, the semiconductor memory according to the present invention is illustrated using the same numerals for identifying corresponding parts in FIG. 1. Similar to the prior art of FIG. 1, the memory of this invention includes the memory cell array 1 from which 256 bits of stored data are simultaneously read as a single word in response to a read enable pulse from a read/write controller 29 and transferred through transfer gate array 2 to the data register 3 which is in turn connected to the transfer gate array 4. The transfer gate array 4 are divided into 64 groups of 4 bits each, which are respectively identified by a signal on access lines $U_1$ through $U_{64}$ connecting the outputs of a unit data selector 20 to the groups of transfer gate array 4.

The output terminals of all groups of transfer gate array 4 are respectively coupled through data bit lines $A_1$, $A_2$, $A_3$ and $A_4$ to data buffers 21, 22, 23 and 24. The outputs of data buffers 21 to 24 are connected respectively to gate means, such as the source-drain paths of transistors $Q_1$ to $Q_4$ to an external circuit, not shown, via an output buffer amplifier 27. The output of data buffer 24 is further connected through the source-drain path of a transistor $Q_5$ to a latch circuit 25, whose output is coupled through the source-drain path of a transistor $Q_6$ to the output buffer amplifier 27. A data bit selector 26 is provided to apply control pulses through lines $B_1$ to $B_4$ to the gates of transistors $Q_1$ to $Q_4$, respectively. The data bit selector 26 further applies the control pulse on line $B_3$ to the gate of transistor $Q_5$ and to the latch 25 as a latch enable pulse, and a control pulse through a line $B_5$ to the gate of transistor $Q_6$.

Data bit selector 26 synchronously operates with the system clock supplied from clock source 28 and is responsive to an address signal supplied on a bus ADRS-2 and an address timing pulse from the read/write controller 29. As will be described, the address timing pulse occurs at variable intervals proportional to the number of data bits to be transferred from the memory cell array 1. In response to the address timing pulse, the read/write controller 29 supplies an address signal through bus ADRS 1 to the unit data selector 20 which, in response, activates one of the access lines $U_1$ to $U_{64}$.

Figure 3:
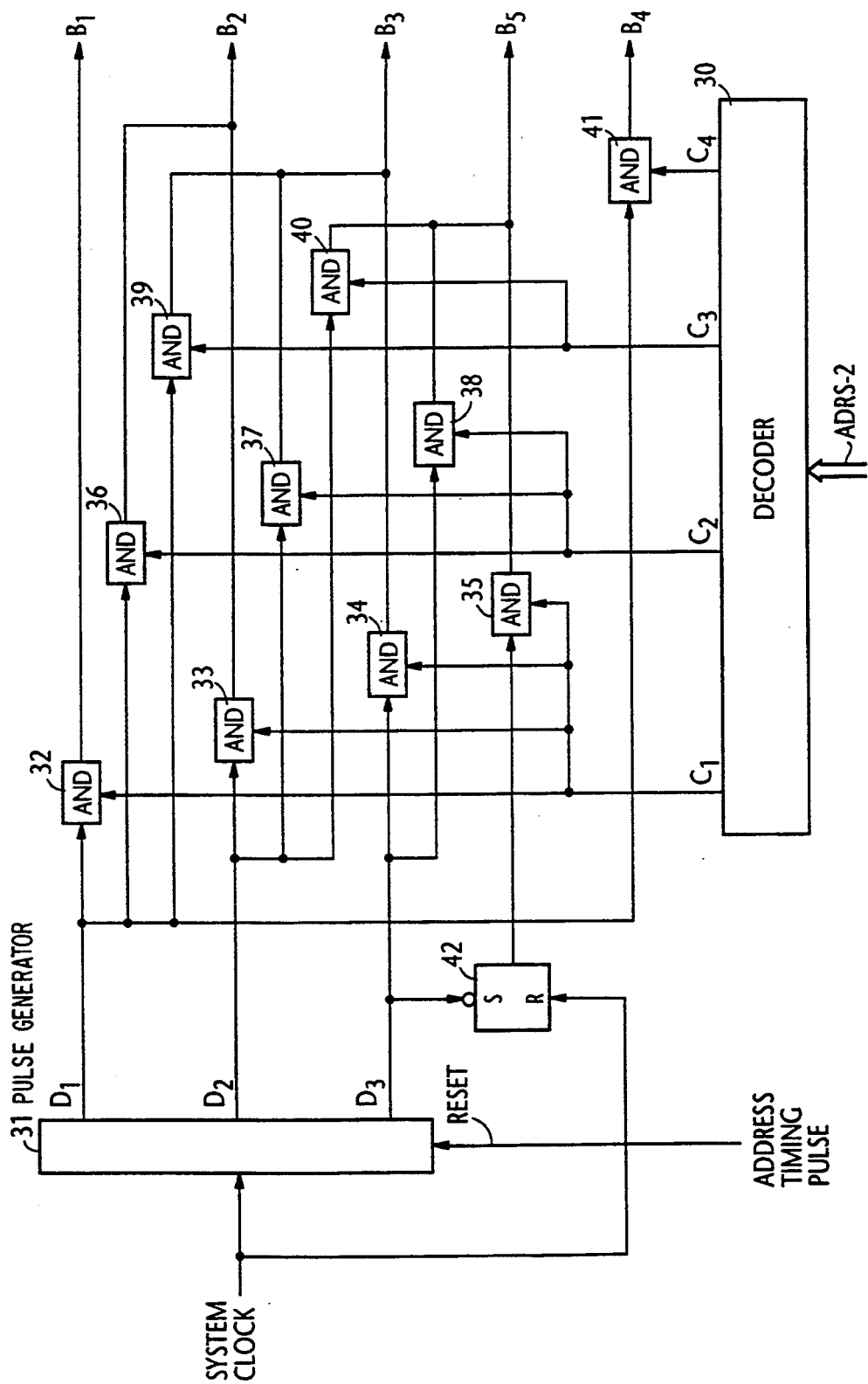
FIG. 3 is a block diagram of the data bit selector of FIG. 1.

As illustrated in FIG. 3, the data bit selector 26 comprises an address decoder 30, a pulse generator 31 and an array of AND gates 32 to 41. Address decoder 30 has four output terminals $C_1$ to $C_4$, with the terminal $C_1$ being connected to the AND gates 32, 33, 34 and 35. The outputs of these AND gates are connected respectively to the output terminals $B_1$, $B_2$, $B_3$ and $B_5$ of the data bit selector. The terminal $C_2$ of address decoder 30 is connected to the AND gates 36, 37 and 38, the outputs of these gates being connected respectively to the output terminals $B_2$, $B_3$ and $B_5$. The terminal $C_3$ of the address decoder is connected to the AND gates 39, and 40, whose outputs are respectively coupled to the terminals $B_3$ and $B_5$. On the other hand, the terminal $C_4$ is connected to the AND gate 41 whose output is connected to the terminal $B_4$.

The system clock from clock source 28 is applied to the pulse generator 31 as a triggering pulse and the address timing pulse from the read/write controller 29 is supplied to it as a reset pulse to clear its contents. Pulse generator 31, which may be implemented with a shift register, has three parallel output terminals $D_1$ to $D_3$, with the terminal $D_1$ being connected to the inputs of AND gates 32, 36, 39 and 41, the terminal $D_2$ being connected to the inputs of AND gates 33, 37 and 40, and the terminal $D_3$ being connected to the AND gates 34 and 38. The terminal $D_3$ is further connected to the negative set input of a flip-flop 42 whose output of flip-flop 42 is connected to the input of AND gate 35. Flip-flop 42 responds to the trailing edge of a pulse on terminal $D_3$ to change the output logic state to "high" and responds to the leading edge of a clock pulse from the system clock source 28 to change the output state to "low", producing a pulse following a pulse on terminal $D_3$.

The output terminals $C_1$ to $C_4$ of address decoder 30 correspond respectively to the four data bits of each selected unit data and one of terminals $C_1$ to $C_4$ which corresponds to the first bit of the selected data bits is activated (i.e., driven to high level). For example, if data bits #0, #1, #2 and #3 were to be transferred from memory cell array 1 to buffers 21 to 24, terminal $C_1$ corresponds to the first bit #0, and the unit data selector 20 selects the first unit data by activating the access line $U_1$. The address signal on bus ADRS-2 identifies data bits #0, #1, #2 and #3 and, in response, the address decoder 31 activates terminal $C_1$.

The operation of this invention will be best understood with the following description given with reference to a timing diagram shown in FIG. 4 by assuming that four-bit data (#0~#3) and (#4~#7) are initially to retrieved from data register 3 in sequence and the address is then jumped to two-bit data (#202, #203), then to three-bit data (#221, #222, #223), and further to single bit data #231, and the address is finally returned to four-bit data (#8~#11).

In response to the leading edge of a system clock pulse 50 an address timing pulse 60 is generated by read/writer controller 29 and a first address signal identifying the access line $U_1$ is supplied on bus ADRS-1 to unit data selector 20 which, in response, activates the access line $U_1$, producing a pulse 70 to transfer data bits #0 to #3 from memory 1 to data buffers 21 to 24, respectively. Concurrently, a second address signal identifying the first bit of the transferred data bits, i.e., bit #0 is applied on bus ADRS-2 from read/write controller 29 to the address decoder 30 of data bit selector 26.

In response to address timing pulse 60, the pulse generator 31 of data bit selector 26 is cleared and starts counting the system clock and produces an output pulse 80 on terminal $D_1$. In response to clock pulses 52 and 53, pulse generator 31 is advanced in sequence to produce output pulses 81 and 82 on terminals $D_2$ and $D_3$, respectively. In response to the second address signal signifying the first bit #0, address decoder 30 activates the lead $C_1$ to enable AND gates 32, 33, 34 and 35. Therefore, pulses 80, 81, and 82 are sequentially applied through AND gates 32, 33 and 34 to the output terminals $B_1$, $B_2$, and $B_3$, respectively. As a result, transistors $Q_1$ and $Q_2$ are turned on in sequence in response to pulses 80 and 81, and transistors $Q_3$ and $Q_5$ are simultaneously turned on following the turn-on of transistor $Q_2$ and data bits #0, #1 and #2 are sequentially read out of buffers 21, 22 and 23 to the output buffer 27, while the fourth data bit #3 is read out of buffer 24 and stored in latch 25. The pulse 82 on terminal $D_3$ causes flip-flop 42 to produce a pulse 83 which is passed through AND gate 35 to terminal $B_5$, causing transistor $Q_6$ to be turned on to deliver the latched data bit #3 to the output buffer amplifier 27.

A similar event occurs in response to a subsequent clock pulse 54. Clock pulse 54 causes an address timing pulse 61 to be produced, activating the access line $U_2$ with a pulse 71 to transfer data bits #4 to #7 to buffers 21 through 24, respectively. An address signal indicating the first bit #4 of the second unit data causes the terminal $C_1$ of address decoder 30 to be activated, and pulses 84, 85 and 86 are sequentially generated by pulse generator 31 and applied through AND gates 32, 33 and 34 to output terminals $B_1$, $B_2$, and $B_3$, respectively. Thus, data bits #4, #5 and #6 are sequentially read out of buffers 21, 22 and 23 onto the output buffer amplifier 27, while storing data bit #7 in latch 25. Following pulse 86 a pulse 87 is produced and applied through AND gate 35 to terminal $B_5$ to output the latched data bit #7 to the buffer amplifier 27.

An address timing pulse 62 is produced for the next unit data in response to a clock pulse 55 and an access line $U_{s1}$ is activated with a pulse 72 to transfer the unit data #200 to #203 to buffers 21 to 24. To read out the two data bits #202 and #203, an address signal indicating the first bit #202 is produced to activate the terminal $C_3$ of address decoder 30 to enable AND gates 39 and 40. Pulse generator 31 is responsive to the triggering pulse 62 for producing pulses 88 and 89 on output terminals $D_1$ and $D_2$ in succession. These pulses are supplied through AND gates 39 and 40 to output terminals $B_3$ and $B_5$, respectively. Transistors $Q_3$ and $Q_5$ are simultaneously turned on in response to pulse 88 to read out data bit #202 from buffer 23 to amplifier 27, while storing data bit #204 in latch 25. Transistor $Q_6$ is turned on in response to pulse 89 to output the latched data bit to output amplifier 27.

An address timing pulse 63 is produced for the next unit data in response to a clock pulse 56 and an access line $U_{56}$ is activated with a pulse 73 to transfer the 56th unit data to buffers 21 to 24. To read out the three data bits #221 and #223 of the unit data, an address signal indicating the first bit #221 is produced to activate the terminal $C_2$ of address decoder 30 to enable AND gates 33, 37 and 38. Pulse generator 31 responds to the triggering pulse 63 by producing pulses 90, 91 and 92 on output terminals $D_1$, $D_2$ and $D_3$ in succession. These pulses are supplied through AND gates 36, 37 and 38 to output terminals $B_2$, $B_3$ and $B_5$, respectively. Transistor $Q_2$ is turned on in response to pulse 90 to read out data bit #221 from buffer 22 and transistors $Q_3$ and $Q_5$ are simultaneously turned on in response to pulse 91 to read out data bit #222 from buffer 23 to output buffer amplifier 27, while storing data bit #223 in latch 25. Transistor $Q_6$ is turned on in response to pulse 92 to output the latched data bit #223 to amplifier 27.

Next, an address timing pulse 64 is produced for the next unit data in response to a clock pulse 57 and an access line $U_{58}$ is activated with a pulse 74 to transfer the 58th unit data to buffers 21 to 24. To read out the single data bit #231, an address signal indicating it is produced to activate the terminal $C_4$ of address decoder 30 to enable AND gate 41. Pulse generator 31 responds to the triggering pulse 64 by producing on terminal $D_1$ a pulse 93 which is supplied through AND gate 41 to output terminal $B_4$ and transistor $Q_4$ is turned on to read out data bit #231 from buffer 24 to buffer amplifier 27. Since no latch pulse is generated at terminal $B_3$, the previously stored data bit #223 remains in the latch 25.

An event similar to the readout of four-bit unit data occurs in response to a subsequent clock pulse 58 which causes an address timing pulse 65 to be produced, activating the access line $U_3$ with a pulse 75 to transfer data bits #8 to #11 to buffers 21 through 24, respectively. An address signal indicating the first bit #8 of the third unit data causes the terminal $C_1$ to be activated, and pulses 94, 95 and 96 are sequentially supplied from pulse generator 31 through AND gates 32, 33 and 34 to output terminals $B_1$, $B_2$, and $B_3$, respectively. Data bits #8 to #10 are sequentially delivered to output buffer amplifier 27, while storing data bit #11, instead of data bit #223, in latch 25 in response to pulse 96, which is then delivered the buffer amplifier 27 in response to pulse 97.

It is seen that when reading second to fourth data bits in sequence from the data buffers, the fourth bit is stored in latch 25 at the time of delivery of the third bit from buffer 23 to the output buffer amplifier 27 and the latched data bit is delivered at the same time the next unit data is transferred to the data buffers 21~24. When reading only the fourth bit, it is simply read out from buffer 24 to the output amplifier simultaneously with the transfer of the next unit data to the data buffers. As a result, high speed memory read operation can be achieved. Further, the use of only one set of data buffers eliminates the need to divide the memory cell array 1 into two halves for alternate reading, thus allowing data bits to be retrieved in sequence from any location of the data register 3. Because of the use of a single set of data buffers, the circuit complexity is reduced in comparison with the prior art of FIG. 1.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A circuit arrangement for reading data bits from a memory cell array, comprising:
    a data register for storing the data bits from the memory cell array;
    a transfer gate array connected to said data register, said transfer gate array being equally divided into groups of first to k-th transfer gates;
    first to k-th data buffers connected respectively to the first to k-th transfer gates of different groups;
    first readout means for selecting one of said groups of transfer gates and causing the transfer gates of the selected group to transfer first to k-th data bits of unit data from said data register to said first to k-th data buffers, respectively;
    a latch circuit; and
    second readout means for selecting i-th to k-th data bits stored in the i-th to the k-th data buffers (where i is in a range from 1 to k), and if i is not equal to k, sequentially reading the i-th to (k−1)th data bits from said data buffers to an output terminal of the circuit arrangement, storing the k-th data bit from the k-th data buffer into said latch circuit when said (k−1)th data bit is read and reading the k-th data bit from said latch circuit to said output terminal when data bits of subsequent unit data are transferred to said data buffers, and if i is equal to k, reading the k-th data bit from said k-th data buffer to said output terminal when data bits of subsequent unit data are transferred to said data buffers.

2. A circuit arrangement as claimed in claim 1, wherein said second readout means comprises:
    first to k-th gate means connected respectively between the outputs of said first to k-th data buffers and said output terminal of the circuit arrangement;
    a (k+1)th gate means connected between the output of the k-th data buffer and the input of said latch circuit;
    a (k+2)th gate means connected between the output of the latch circuit and the output terminal of the circuit arrangement; and
    means, operable when the selected i-th data bit is not equal to the k-th data bit, for sequentially activating the i-th to (k−1)th gate means and activating the (k+1)th gate means and said latch circuit simultaneously when the (k−1)th gate means is activated, and activating the (k+2) gate means when data bits said subsequent unit data are transferred to said data buffers, and operable, when the selected i-th data bit is equal to the k-th data bit, for activating said k-th gate means simultaneously with the transfer of data bits of said subsequent unit data to said data buffers.

3. In a circuit arrangement for a memory cell array in which data bits are stored, comprising a data register coupled to said memory cell array for storing data bits read out of the memory cell array, a transfer gate array connected to said data register, said transfer gate array being equally divided into groups of first to k-th transfer gates, first to k-th data buffers connected respectively to the first to k-th transfer gates of different groups, and a latch circuit, said groups of transfer gates corresponding respectively to a plurality of unit data each comprising first to k-th data bits, a method comprising the steps of:

a) selecting one of said unit data and selecting i-th to k-th data bits of the selected unit data (where i is in a range from 1 to k);

b) causing the transfer gates of the group corresponding to the selected unit data to transfer the first to k-th data bits of the selected unit data from said data register to said first to k-th data buffers, respectively;

c) if i is not equal to k, sequentially reading the i-th to (k−1)th data bits from said data buffers to an output terminal of the circuit arrangement;

d) storing the k-th data bit from the k-th data buffer into said latch circuit when said (k−1)th data bit is read;

e) reading the k-th data bit from said latch circuit to said output terminal when data bits of subsequent unit data are transferred by the step (b) to said data buffers; and f) if i is equal to k, reading the k-th data bit from said k-th data buffer to said output terminal when data bits of subsequent unit data are transferred by the step (b) to said data buffers.

* * * * *

UNITED STATES PATENT AND TRADEMARK OFFICE
CERTIFICATE OF CORRECTION

PATENT NO. : 5,394,364

DATED : February 28, 1995

INVENTOR(S) : Masuda

It is certified that error appears in the above-identified patent and that said Letters Patent is hereby corrected as shown below:

Column 4, line 68, delete "Us1" and insert --$U_{51}$--.

Signed and Sealed this

Twentieth Day of June, 1995

*Attest:*

BRUCE LEHMAN

*Attesting Officer*     *Commissioner of Patents and Trademarks*